(12) United States Patent
Lee et al.

(10) Patent No.: US 12,070,869 B2
(45) Date of Patent: Aug. 27, 2024

(54) SOLAR PANEL CUTTING UNIT

(71) Applicant: WON KWANG S&T CO., LTD., Incheon (KR)

(72) Inventors: Sang Hun Lee, Incheon (KR); Jun Kee Kim, Seoul (KR); Tae Eun Lee, Incheon (KR); Cheong Min Noh, Incheon (KR)

(73) Assignee: WON KWANG S&T CO., LTD., Incheon (KR)

( * ) Notice: Subject to any disclaimer, the term of this patent is extended or adjusted under 35 U.S.C. 154(b) by 296 days.

(21) Appl. No.: 17/783,437

(22) PCT Filed: Oct. 26, 2021

(86) PCT No.: PCT/KR2021/015110
§ 371 (c)(1),
(2) Date: Jun. 8, 2022

(87) PCT Pub. No.: WO2022/114544
PCT Pub. Date: Jun. 2, 2022

(65) Prior Publication Data
US 2023/0347538 A1 Nov. 2, 2023

(30) Foreign Application Priority Data
Nov. 25, 2020 (KR) .......................... 10-2020-0160309

(51) Int. Cl.
*B26D 1/553* (2006.01)
*B26D 1/00* (2006.01)
(Continued)

(52) U.S. Cl.
CPC .......... *B26D 1/553* (2013.01); *B26D 1/0006* (2013.01); *B26D 3/28* (2013.01); *H01L 31/18* (2013.01); *B26D 2001/008* (2013.01)

(58) Field of Classification Search
CPC .... B26D 1/553; B26D 1/0006; B26D 1/5475; B26D 3/28; B26D 2001/008; H01L 31/18
(Continued)

(56) References Cited

U.S. PATENT DOCUMENTS

2018/0085969 A1* 3/2018 Takahashi .............. B28D 5/045
2020/0147821 A1* 5/2020 Carrasco .............. B26D 7/0633
(Continued)

FOREIGN PATENT DOCUMENTS

JP 6104141 B2 3/2017
JP 6271468 B2 1/2018
(Continued)

*Primary Examiner* — Omar Flores Sanchez
(74) *Attorney, Agent, or Firm* — The PL Law Group, PLLC (57) ABSTRACT

A solar panel cutting unit includes a frame, a panel transporting mechanism at the frame to lower the solar panel in a vertical direction, first guide roller units below the panel transporting mechanism to guide and lower the solar panel, a first wire cutting mechanism including first support rollers and a first cutting wire connecting the first support rollers to each other and extending in the same direction as the adhesion lines such that the first wire cutting mechanism separates one of the thin layers from the solar panel, and a second wire cutting mechanism below the first wire cutting mechanism and including second support rollers and a second cutting wire connecting the second support rollers to each other and moving in parallel to the first cutting wire such that the second wire cutting mechanism separates another of the thin layers from the solar panel.

7 Claims, 8 Drawing Sheets

(51) Int. Cl.
*B26D 3/28* (2006.01)
*H01L 31/18* (2006.01)

(58) Field of Classification Search
USPC .................................................... 83/870, 156
See application file for complete search history.

(56) References Cited

U.S. PATENT DOCUMENTS

2020/0198316 A1* 6/2020 Coustier .............. B26D 1/5475
2023/0211597 A1* 7/2023 Lee ........................... B09B 5/00
83/803

FOREIGN PATENT DOCUMENTS

| KR | 10-0783028 B1 | 12/2007 |
| KR | 10-0917406 B1 | 9/2009 |
| KR | 10-1685329 B1 | 12/2016 |
| KR | 10-2091346 B1 | 3/2020 |
| KR | 10-2101583 B1 | 5/2020 |
| KR | 10-2154030 B1 | 9/2020 |
| KR | 10-2021-0015287 A | 2/2021 |
| KR | 10-2246155 B1 | 4/2021 |

* cited by examiner

SOLAR PANEL CUTTING UNIT

This invention was made with government support under the national R&D program of South Korea (Project Identification Number: 1485017207; Project Number: 2020003100003; Ministry Name: Ministry of Environment; Project Management (Specialized) Institute Name: Korea Environmental Industry & Technology Institute; Research Program Title: Technology Development Program for Improvement in Cyclical Availability of Recycling Inhibitory Product; Research Project Title: Technology Development of Collecting Discarded Solar Panel and Collecting Crush-Based Valuable Material; Contribution Ratio: 1/1; Project Performing Agency Name: WonKwang S&T Co., Ltd.; Research Period: May 21, 2020 to Dec. 31, 2022) awarded by Korea Ministry of Environment (MOE).

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2021/015110, filed Oct. 26, 2021, which claims priority to the benefit of Korean Patent Application No. 10-2020-0160309 filed in the Korean Intellectual Property Office on Nov. 25, 2020, the entire contents of which are incorporated herein by reference.

BACKGROUND

1. Technical Field

The present invention relates to a solar panel cutting unit, and more specifically to a solar panel cutting unit that can separate layers of a solar panel from each other with accuracy.

2. Background Art

The solar power generation industry is an eco-friendly power generation industry in which a fossil fuel is not used and has been steadily growing since early 2000. The growth of the solar power generation industry results in a steady increase in the number of solar panels which are installed throughout South Korea, and thus a problem of disposing of old solar panels arises. A service life of a solar panel is about 15 to 25 years, although it may be different for each product. Recently, as performance of the solar panel is improved, a solar panel having low power generation efficiency is culled early, and thus the number of discarded solar panels is rapidly increased.

The number of discarded solar panels is expected to gradually increase in the future, and thus various technologies for disposing discarded solar panels are currently proposed. One of the common methods for disposing solar panels is a method to first physically separate an aluminum frame from the solar panel and then crush and bury a panel substrate or to recycle extractable metal or the like such as copper or silver through a chemical treatment. However, a chemical treatment method is limitedly used because of a possibility of causing another problem of environmental pollution. In addition, there is no easy method for separating a glass plate and a backsheet layer from the solar panel, and thus a separation process or apparatus needs to be improved.

In particular, since an adhesive layer provided between layers of a solar panel to connect the layers has a thin thickness, it is difficult to separate the layers from each other with accuracy, and thus, a problem arises in that layers of the solar panel are not easy to separate with accuracy from each other by an existing process or apparatus.

SUMMARY

A technical object to be achieved by the present invention is to provide a solar panel cutting unit that can separate layers of a solar panel from each other with accuracy.

Technical objects of the present invention are not limited to the technical object mentioned above, and the following description enables those skilled in the art to clearly understand other unmentioned technical objects.

According to the present invention, there is provided a solar panel cutting unit according that separates a plurality of thin layers of the solar panel from each other, and the solar panel cutting unit includes: a frame; a panel transporting mechanism that is provided at the frame and lowers the solar panel in a vertical direction such that adhesion lines of the thin layers are arranged downward; a pair of first guide roller units that is positioned below the panel transporting mechanism and guides and lowers the solar panel; a first wire cutting mechanism that includes a pair of first support rollers and a first cutting wire which connects the first support rollers to each other and extends in the same direction as the adhesion lines such that the first wire cutting mechanism separates any one of the thin layers from the solar panel; and a second wire cutting mechanism that is positioned below the first wire cutting mechanism and includes a pair of second support rollers and a second cutting wire which connects the second support rollers to each other and moves in parallel to the first cutting wire such that the second wire cutting mechanism separates another one of the thin layers from the solar panel.

The first wire cutting mechanism and the second wire cutting mechanism may be individually movable in a horizontal direction such that a distance between the first cutting wire and the second cutting wire is adjusted.

The solar panel cutting unit may further include an image recognition unit that is provided below the first cutting wire and the second cutting wire, images the solar panel and the cutting wires, and locates the adhesion lines and the cutting wires.

The solar panel may have a plurality of the adhesion lines formed in parallel between the plurality of thin layers. The first cutting wire may cut any one of the plurality of adhesion lines to first separate any one of the plurality of thin layers, and the second cutting wire may cut another one of the plurality of adhesion lines to sequentially separate another one of the plurality of thin layers.

The solar panel cutting unit may further include a pair of second guide roller units that is positioned between the first cutting wire and the second cutting wire, guides the solar panel which moves past the first cutting wire and from which any one of the thin layers is removed, and supplies the solar panel to the second wire cutting mechanism.

The solar panel cutting unit may further include a discharge roller that is provided between the first cutting wire and the second guide roller units, guides the thin layer separated from the solar panel, and discharges the solar panel outside.

The discharge roller may suction and wind the thin layer into a roll shape and discharge the thin layer.

The solar panel cutting unit according to the present invention has advantages in that several layers stacked in a solar panel can be easily separated from each other with accuracy, and the separated thin layers can be recycled suitably regarding materials thereof.

In particular, very thin adhesive portions between the thin layers of the solar panel can be accurately cut using a plurality of wires. Further, the solar panel cutting unit has an advantage in that the plurality of wires can independently move such that solar panels having various sizes with respective distances between thin layers are all processed.

In addition, in a process of separating the layers of the solar panel from each other, the solar panel can be heated to melt the adhesive layer, and thus a glass layer can be easily separated with less force.

DETAILED DESCRIPTION

Advantages, features, and methods for achieving the advantages and the features are to be more clearly described with reference to embodiments which will be described below in detail together with the accompanying drawings. However, the present invention is not limited to the embodiments disclosed hereinafter but can be realized in various different embodiments; simply, the embodiments are provided to complete the disclosure of the present invention and completely inform those with ordinary skill in the art to which the present invention pertains of the scope of the present invention, and the present invention is only defined by the scope of the claims. Through the entire specification, the same reference signs represent the same configurational elements, respectively.

Hereinafter, a solar panel cutting unit according to an embodiment of the present invention will be described in detail with reference to FIGS. 1 to 9.

Figure 1:
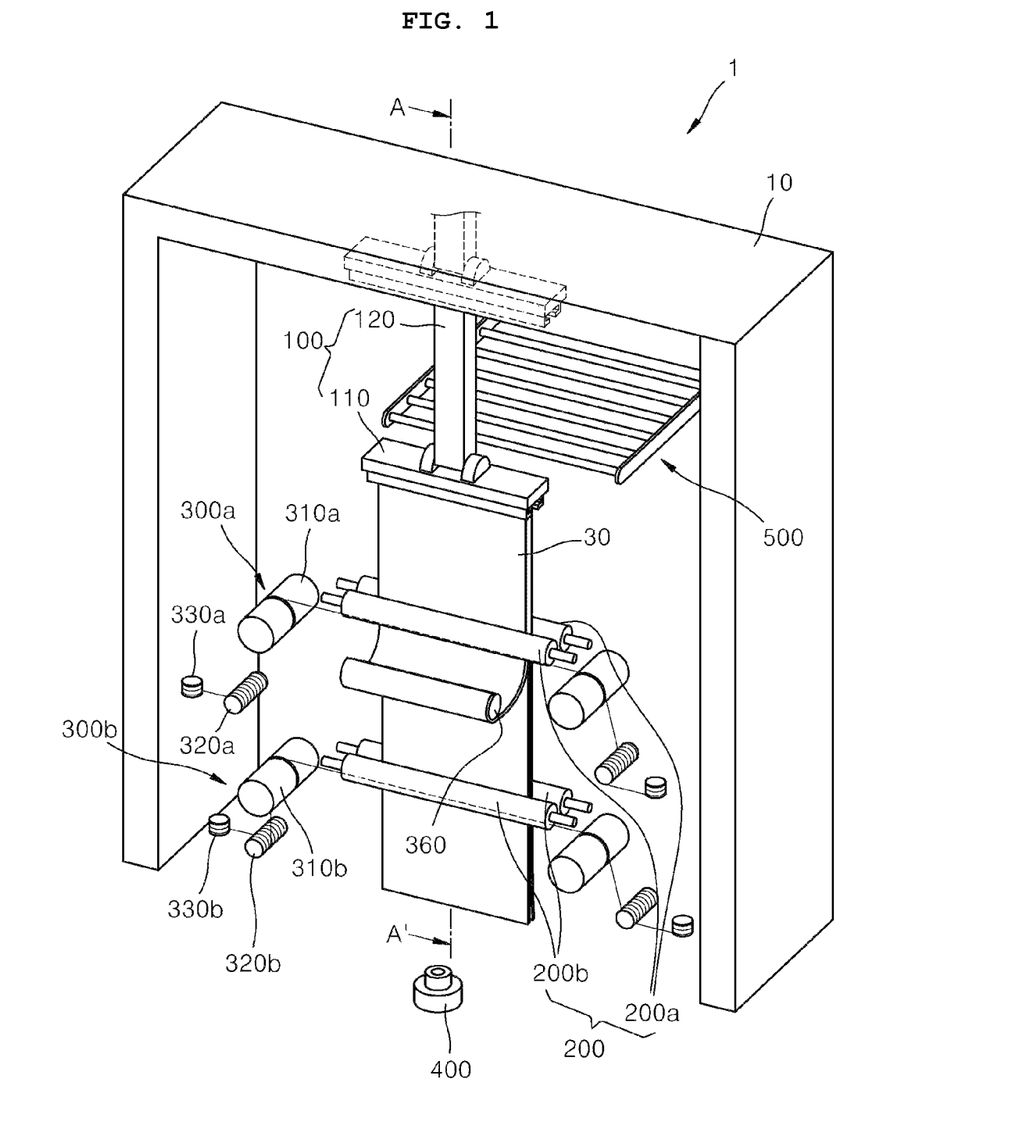
FIG. 1 is a perspective view illustrating a solar panel cutting unit according to an embodiment of the present invention.
Figure 2:
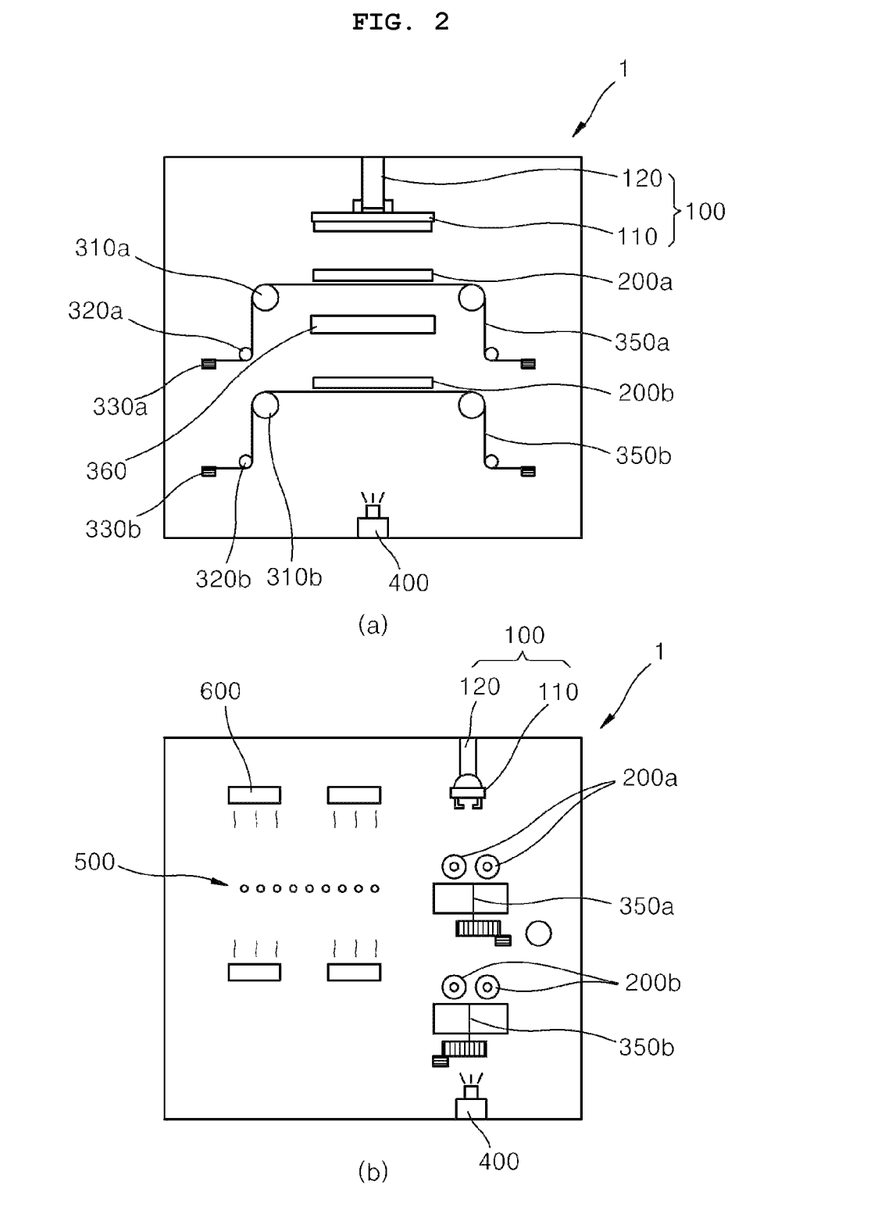
FIG. 2 is a view schematically illustrating the solar panel cutting unit illustrated in FIG. 1.
Figure 3:
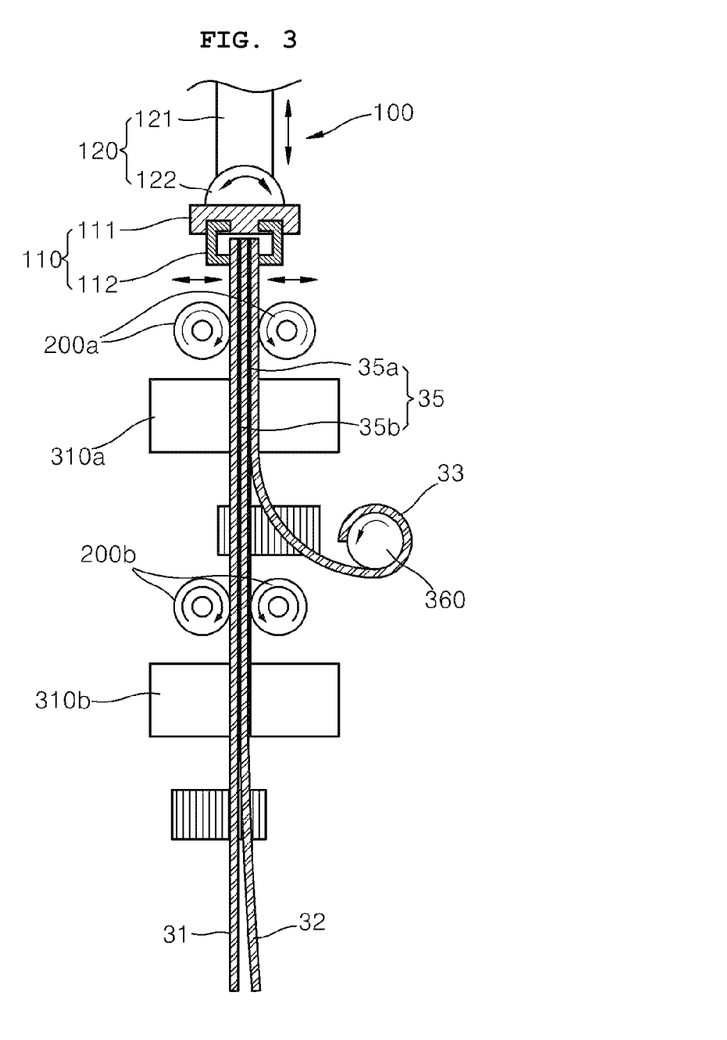
FIG. 3 is a cross-sectional view taken along line A-A' in FIG. 1.
Figure 4:
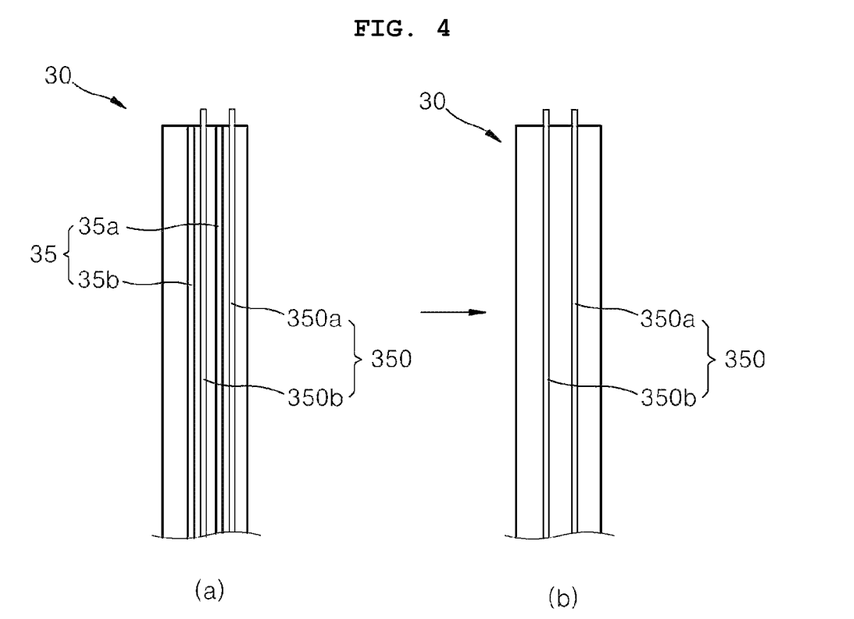
FIG. 4 is a view illustrating a usage example of an image recognition unit.

FIG. 1 is a perspective view illustrating a solar panel cutting unit according to an embodiment of the present invention. FIG. 2 is a view schematically illustrating the solar panel cutting unit illustrated in FIG. 1. FIG. 3 is a cross-sectional view taken along line A-A' in FIG. 1. FIG. 4 is a view illustrating a usage example of an image recognition unit.

With reference to FIGS. 1 to 3, a solar panel cutting unit 1 according to the present invention can separate several layers stacked in a solar panel 30 from each other. The solar panel 30 has a structure in which a glass plate 31, a solar cell layer 32, and a backsheet layer 33 are stacked sequentially. In other words, as illustrated in FIG. 3, the solar panel 30 has a structure in which the glass plate 31, a first adhesive layer 35a, the solar cell layer 32, a second adhesive layer 35b, and the backsheet layer 33 are stacked sequentially and adhered to each other. In this specification, a thin layer indicates each of the glass plate 31, the solar cell layer 32, and the backsheet layer 33, and an adhesion line indicates a line formed by the first adhesive layer 35a and the second adhesive layer 35b between each of the thin layers. The number of adhesion line can be increased or decreased depending on the number of thin layers.

The solar panel cutting unit 1 can stand the solar panel 30 vertically upright and can accurately cut along the thin adhesion lines. The solar panel cutting unit 1 cuts from a lower end portion toward an upper end portion of the vertically upright solar panel 30 and cut along the adhesion lines by using thin wires. When the solar panel 30 is cut in a horizontal state, a cutting force is applied in a horizontal direction and the force of gravity is applied in a vertical direction, thus the thin layers press the wires in the direction of gravity. Hence, accuracy is decreased, and the cutting force is remarkably decreased. The solar panel cutting unit 1 has an efficient structure of standing the solar panel 30 vertically upright and cutting the solar panel by inhibiting the accuracy and the cutting force from being decreased.

In particular, the solar panel cutting unit 1 can sequentially separate the plurality of thin layers of the solar panel 30 from each other. The solar panel cutting unit 1 can primarily cause a first cutting wire 350a to penetrate the first adhesive layer 35a and cut the first adhesive layer, and can secondarily cause a second cutting wire 350b to penetrate the second adhesive layer 35b and cut the second adhesive layer. In this case, an image recognition unit 400 images the solar panel 30 and the cutting wires 350 and enables a cutting process to be accurately performed by matching positions of the adhesion lines and the cutting wires 350. Further, a thin layer separated by the first cutting wire 350a can be wound along an outer peripheral surface of a discharge roller 360, and the thin layer wound into a roll shape can be discharged.

Hereinafter, specific configurations of the solar panel cutting unit 1 will be described.

The solar panel cutting unit 1 is configured as follows. The solar panel cutting unit 1 separates the plurality of thin layers of the solar panel 30 from each other, and the solar panel cutting unit 1 includes a frame 10, a panel transporting mechanism 100 that is provided at the frame 10 and lowers the solar panel 30 in a vertical direction such that the adhesion lines of the thin layers are arranged downward, a pair of first guide roller units 200a) that is positioned below the panel transporting mechanism 100 and guides and lowers the solar panel 30, a first wire cutting mechanism 300a that includes a pair of first support rollers 310a and the first cutting wire 350a which connects the first support rollers 310a to each other and extends in the same direction as the adhesion lines such that the first wire cutting mechanism separates any one of the thin layers from the solar panel 30, and a second wire cutting mechanism 300b that is positioned below the first wire cutting mechanism 300a and includes a pair of second support rollers 310b and the second cutting wire 350b which connects the second support rollers 310b to each other and moves in parallel to the first cutting wire 350a such that the second wire cutting mechanism separates another one of the thin layers from the solar panel.

First, the panel transporting mechanism 100 is provided at an upper part of the frame 10, holds an end portion of the solar panel 30, and lowers the solar panel in the vertical direction. In addition, the panel transporting mechanism 100 has functions of standing the horizontally supplied solar panel 30 vertically upright and lowering the solar panel in the vertical direction. The panel transporting mechanism 100 is provided to be movable along the frame 10, and a height and an angle of the panel transporting mechanism can be adjusted. That is, the panel transporting mechanism 100 can be a device such as an industrial robot that can freely move. The panel transporting mechanism 100 can vertically lift the solar panel 30 which is transported along a horizontal moving mechanism 500 located at one side. The horizontal moving mechanism 500 can be configured of a plurality of transport rollers and can transport the solar panel 30 in a state where a reflective surface of the solar panel 30 is parallel to the ground.

The panel transporting mechanism 100 includes a holder 110 which holds the solar panel 30 and a manipulation element 120 which enables the holder 110 to move and rotate.

The manipulation element 120 is operated to vertically lift the horizontally supplied solar panel 30 and can adjust a location and an angle of the solar panel 30. The manipulation element 120 has a cylinder shape, in which a length of a body can be adjusted, and is provided to be movable at the upper part inside the frame 10. The manipulation element 120 includes a vertical manipulation element 121 which is movable along the frame 10 and of which a length of a body is adjustable and a rotational manipulation element 122 which is provided at an end of the vertical manipulation element 121 and rotatably connects the holder 110 and the vertical manipulation element 121 to each other. The holder 110 can be rotatably coupled to the rotational manipulation element 122 positioned at an end of the manipulation element 120 and can hold and fix the solar panel 30. Specific configurations of the manipulation element 120 and the holder 110 will be described below in detail. On the other hand, the panel transporting mechanism 100 is not limited to the embodiment of the present invention and can be variously modified. For example, the panel transporting mechanism 100 can have a roller shape to hold both surfaces of the solar panel 30, and the entire roller can be moved to rotate the solar panel 30 from the horizontal direction to the vertical direction. That is, the panel transporting mechanism 100 can be variously modified to have a structure of holding the horizontally supplied solar panel 30 and lowering the solar panel in the vertical direction.

The guide roller units 200 are positioned below the panel transporting mechanism 100 in a lowering direction of the solar panel 30 and fulfill a function of guiding the solar panel 30 to a lowering location. In this case, the guide roller units 200 enable the solar panel 30 to maintain a plate shape and be accurately supplied to the wire cutting mechanism 300. The guide roller units 200 include the first guide roller units 200a and the second guide roller units 200b which are sequentially positioned in the lowering direction of the solar panel 30.

The pair of first guide roller units 200a is positioned at front and rear sides of the solar panel 30 lowered by the panel transporting mechanism 100, presses front and rear surfaces of the solar panel 30, and transports the solar panel. The pair of first guide roller units 200a can guide a moving direction of the solar panel while being rotatably driven by a drive motor (not illustrated) or being rotated in an unpowered state along with movement of the solar panel 30. The first wire cutting mechanism 300a is positioned below the first guide roller units 200a, and the first wire cutting mechanism 300a separates a thin layer from the solar panel 30 supplied by the first guide roller units 200a. The solar panel 30, from which the thin layer is primarily separated, continues to be lowered by the panel transporting mechanism 100 and penetrates a space between the pair of second guide roller units 200b. In addition, the thin layer separated by the first wire cutting mechanism 300a is wound into a roll shape and is discharged by the discharge roller 360.

The pair of second guide roller units 200b can press front and rear surfaces of the solar panel 30 from which a thin layer is separated and can lower the solar panel. Hence, a gap between the pair of second guide roller units 200b is narrower than a gap between the pair of first guide roller units 200a. Similar to the first guide roller units 200a, the second guide roller units 200b can transport the solar panel 30 while being rotatably driven by a drive motor (not illustrated) or being rotated in an unpowered state along with movement of the solar panel 30. The second wire cutting mechanism 300b is positioned below the second guide roller units 200b, and the second wire cutting mechanism 300b separates a remaining thin layer from the solar panel supplied by the second guide roller units 200b. That is, the solar panel 30 is configured of three thin layers, one thin layer is separated therefrom by the first wire cutting mechanism 300a, the two remaining thin layers are separated from each other by the second wire cutting mechanism 300b, and thus a total of three thin layers are separated independently from each other. As illustrated in FIG. 3, the three thin layers of the solar panel 30 can indicate the glass plate 31, the solar cell layer 32, and the backsheet layer 33, respectively, and can be in a state of adhering to each other by the first adhesive layer 35a and the second adhesive layer 35b. In other words, the solar panel 30 is configured of the glass plate 31, the solar cell layer 32, and the backsheet layer 33, the backsheet layer 33 is separated therefrom by the first wire cutting mechanism 300a, and the glass plate 31 and the solar cell layer 32 are separated from each other by the second wire cutting mechanism 300b.

The wire cutting mechanism 300 includes the first wire cutting mechanism 300a and the second wire cutting mechanism 300b which sequentially separate the thin layers of the solar panel 30 from each other.

The first wire cutting mechanism 300a is positioned below the first guide roller units 200a and cuts the first adhesive layer 35a of the solar panel 30 by using the first cutting wire 350a. The first wire cutting mechanism 300a includes the first cutting wire 350a which extends to correspond to a location of the first adhesive layer 35a and provides a cutting force, the first support rollers 310a which enable tension of the first cutting wire 350a to be maintained and transport the first cutting wire 350a, first auxiliary rollers 320a, and first wire winders 330a. Both ends of the first cutting wire 350a are wound around a pair of first wire winders 330a, respectively, and the first cutting wire cuts the first adhesive layer 35a while moving at a high speed in one direction. In this case, the pair of first support rollers 310a and the pair of first auxiliary rollers 320a are positioned between the pair of first wire winders 330a such that tension of the first cutting wire 350a can be maintained high. The first support rollers 310a, the first auxiliary rollers 320a, and the first wire winders 330a can be rotated independently of each other, and respective rotation directions and speeds thereof can be adjusted depending on moving direction and speed of the first cutting wire 350a. In addition, the number of the auxiliary rollers 320 is not limited thereto, and the auxiliary rollers can be added as necessary for maintaining the tension. Otherwise, the wire winders 330a, around which both end portions of the first cutting wire 350a are wound, are connected to each other, and thus the first cutting wire 350a can move only in one direction on an endless track.

In addition, the pair of first support rollers 310a is arranged to be perpendicular to the first guide roller units 200a and fulfills a function of supporting the first cutting wire 350a which moves in a circumferential direction of the support rollers. In particular, the first support rollers 310a can move in an axial direction and can adjust locations of the first cutting wire 350a which travels by being coupled to outer peripheral surfaces of the first support rollers. The first support rollers 310a can each have a recessed groove in outer peripheral surfaces thereof into which the first cutting wire 350a can be inserted to be fixed. The recessed groove has a shape recessed along the outer peripheral surface of each of the first support rollers 310a, and the first cutting wire 350a can be securely positioned therein. The first cutting wire 350a is arranged to be parallel to the first guide roller units 200a and is disposed at a location which overlaps the first adhesive layer 35a of the solar panel 30. That is, the location of the first cutting wire 350a can be determined by the first support rollers 310a, and the location of the first cutting wire 350a can be adjusted depending on an axial movement of the first support rollers 310a.

The second wire cutting mechanism 300b can be positioned below the second guide roller units 200b and can cut the second adhesive layer 35b of the solar panel 30 by using the second cutting wire 350b. The second wire cutting mechanism 300b includes the second cutting wire 350b which extends to correspond to a location of the second adhesive layer 35b and provides a cutting force, the second support rollers 310b which enable tension of the second cutting wire 350b to be maintained and transport the second cutting wire 350b, second auxiliary rollers 320b, and second wire winders 330b. In this case, a coupling structure of the second support rollers 310b, the second auxiliary rollers 320b, the second wire winders 330b, and the second cutting wire 350b is the same as that of the first wire cutting mechanism 300a.

The backsheet layer 33 separated by the first wire cutting mechanism 300a is made of a flexible material to be wound into a roll shape when the backsheet layer is fixed to the relatively stiff glass plate 31 and then separated therefrom.

The discharge roller 360 can guide the backsheet layer 33 and collect the backsheet layer 33 which is wound around an outer peripheral surface of the discharge roller to be separated. In particular, the discharge roller 360 can be a suction-holding roller which provides a suction force through a through-hole (not illustrated) formed in the outer peripheral surface. Hence, the discharge roller 360 can fix the backsheet layer 33 by providing the suction force through the through-hole when the backsheet layer 33 is to be collected, and the discharge roller can more simply separate and discharge the backsheet layer 33 wound around the outer peripheral surface thereof into a roll shape by applying a repulsive force outward through the through-hole when the backsheet layer 33 is discharged.

Meanwhile, (a) of FIG. 2 is a view schematically illustrating the solar panel cutting unit illustrated in FIG. 1 when viewed from the front thereof, and (b) of FIG. 2 is a view schematically illustrating an appearance of the solar panel cutting unit illustrated in FIG. 1 when viewed from a side thereof. As illustrated in (b) of FIG. 2, heaters 600 can preheat the solar panel 30 transported along the horizontal moving mechanism 500 to decrease adhesive strength of the adhesive layers 35. The heater 600, which is similar to a heating element or the like, can release heat to increase a temperature around the solar panel 30 and can transmit radiant heat to the solar panel 30. The heater 600 can be a heating element similar to a heat transfer pipe, steam, or the like which increases a temperature in the atmosphere. The heater 600 can be positioned along an inner surface of the frame 10 and, furthermore, can be provided to be inserted into the frame 10. A location and a structure of the heater 600 are not limited, and the heater can be modified to have various structure in which heat can be transmitted to the solar panel 30. For example, the heater 600 can be provided at a side surface of the panel transporting mechanism 100 to heat the solar panel 30 lowered along the panel transporting mechanism 100 or can be inserted into shafts of the pair of guide roller units 200 to heat surfaces of the guide roller units 200 and apply conductive heat to the solar panel 30.

When the solar panel 30 having a stacked structure is vertically lowered, the cutting wires 350 penetrate the solar panel, and the glass plate 31, the solar cell layer 32, and the backsheet layer 33 are separated from each other. In this case, sequentially, the first cutting wire 350a can cut the first adhesive layer 35a and the second cutting wire 350b can cut the second adhesive layer 35b.

In addition, the holder 110 is provided to fix an end portion of the solar panel 30 and has a fixing member 111 and fixing pincers 112. The fixing pincers 112 can move in a length direction of the fixing member 111 or can rotate to hold the end portion of the solar panel 30. The pair of fixing pincers 112 can hold and fix the end portion of the solar panel 30 by approaching each other to narrow a gap therebetween. In addition, when the solar panel 30 is lowered to penetrate a half or more part of the guide roller units 200, the fixing pincers 112 can widen the gap therebetween to release the end portion of the solar panel 30.

With reference to FIGS. 4 and 1, FIG. 4 is a view illustrating locations of the solar panel 30, the first cutting wire 350a, and the second cutting wire 350b when the solar panel 30 is vertically lowered, (a) of FIG. 4 illustrates a shape acquired before correction performed by the image recognition unit, and (b) of FIG. 4 illustrates a shape acquired after correction performed by the image recognition unit. As illustrated in FIGS. 4 and 1, the image recognition unit 400 can image locations of the solar panel 30 and the cutting wires 350 and can control the locations thereof. As illustrated in (a) of FIG. 4, the adhesive layers 35 of the solar panel 30 can be disposed at locations which do not correspond to the cutting wires 350. In this case, the image recognition unit 400 can capture an image illustrated in (a) of FIG. 4 from below the wire cutting mechanism 300 and can compare and analyze the locations of the adhesive layers and the cutting wires. In this case, since the gap between the pair of second guide roller units 200b is narrower than the gap between the pair of first guide roller units 200a, locations of the first guide roller units 200a are imaged between the pair of second guide roller units 200b and fixed before locations of the second guide roller units are adjusted. Then, the locations of the second guide roller units 200b can be adjusted. That is, when the image recognition unit determines that the locations of the adhesive layers 35 do not match the locations of the cutting wires 350, the image recognition unit can sequentially adjust the locations of the first guide roller unit 200a and the second guide roller unit 200b and then can adjust the locations of the first wire cutting mechanism 300a and the second wire cutting mechanism 300b. In addition, the locations of the panel transporting mechanism 100 and the guide roller units 200 can be adjusted to overlap the adhesive layers 35 and the cutting wires 350, respectively. In particular, the wire cutting mechanism 300 can move the support rollers 310, which guide the cutting wires 350, in an axial direction to adjust the locations of the cutting wires 350. Otherwise, the panel transporting mechanism 100 and the guide roller units 200 can be both moved such that the locations of the adhesive layers and the cutting wires can be adjusted. Hence, the solar panel cutting unit 1 can perform accurate cutting by adjusting the locations thereof by using the image recognition unit 400 before the cutting is performed.

Hereinafter, an operation process of the solar panel cutting unit according to the embodiment of the present invention will be described in detail with reference to FIGS. 5 to 9.

FIGS. 5 to 9 are operation views of the solar panel cutting unit illustrated in FIG. 1.

Figure 5:
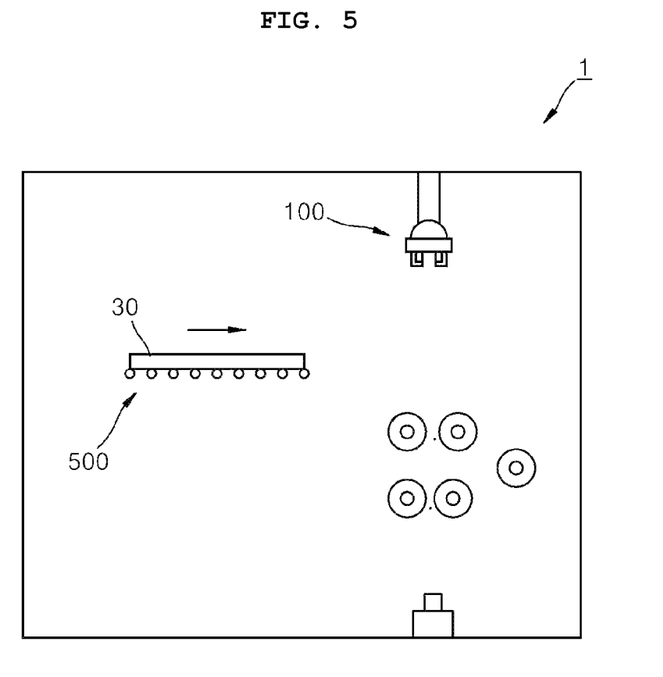
FIGS. 5 to 9 are operation views of the solar panel cutting unit illustrated in FIG. 1.
Figure 6:
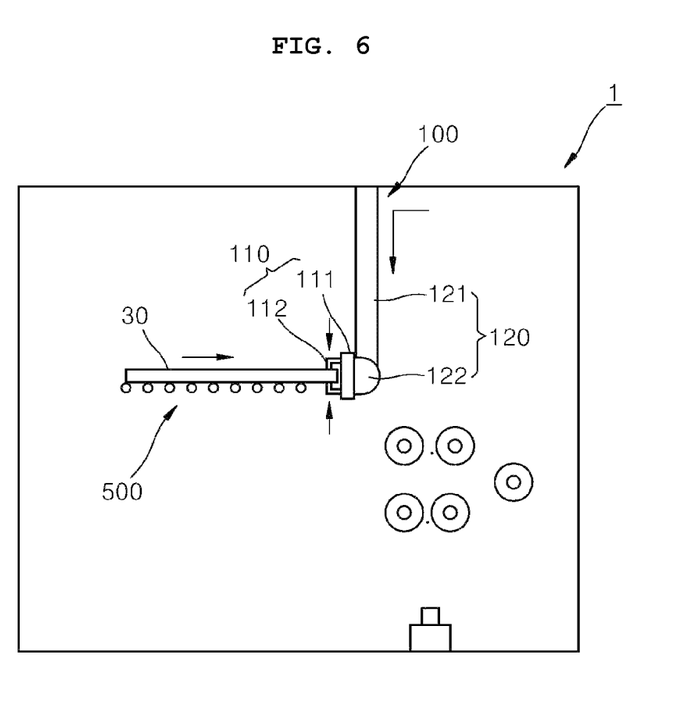
Figure 7:
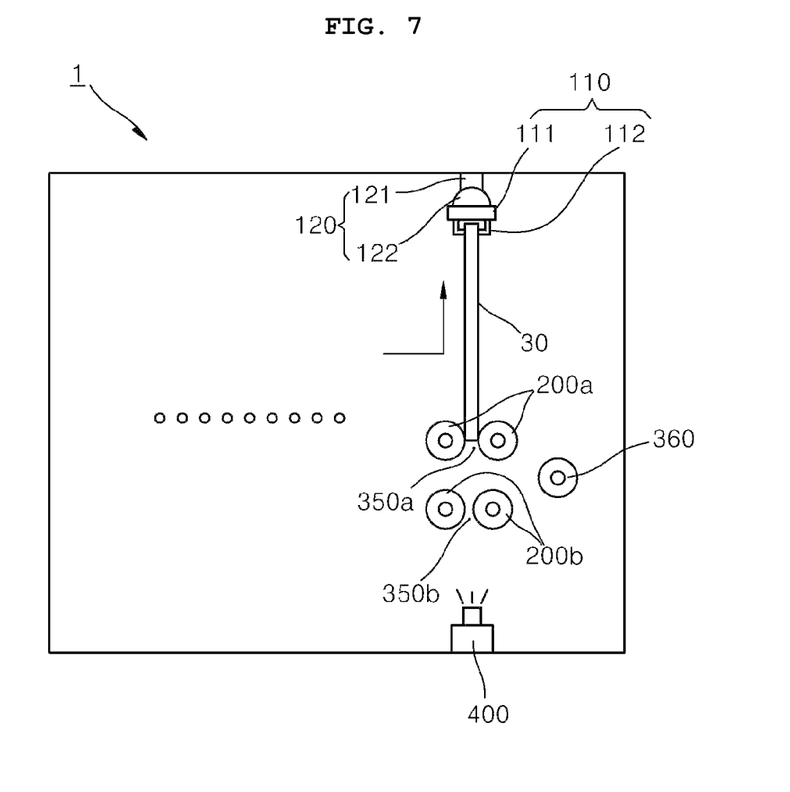
Figure 8:
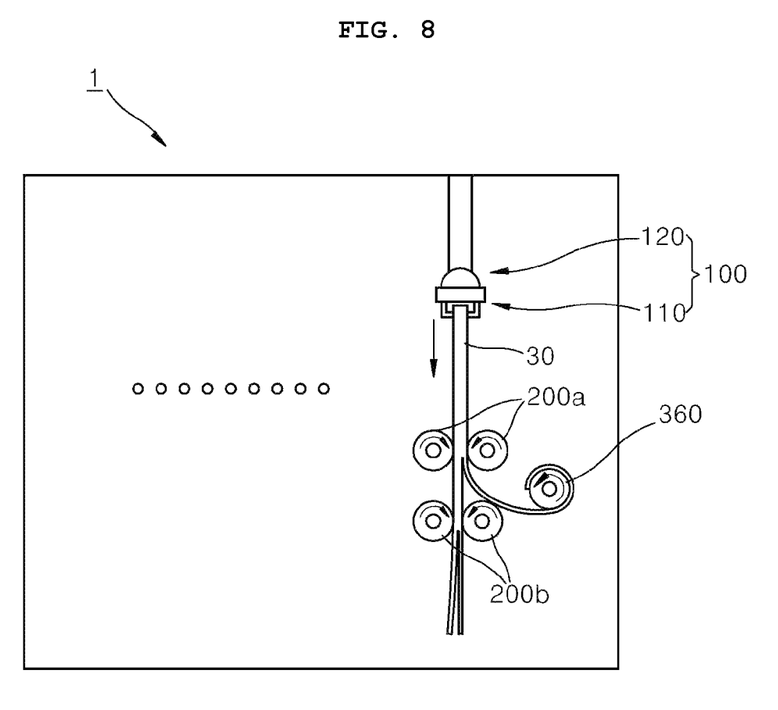
Figure 9:
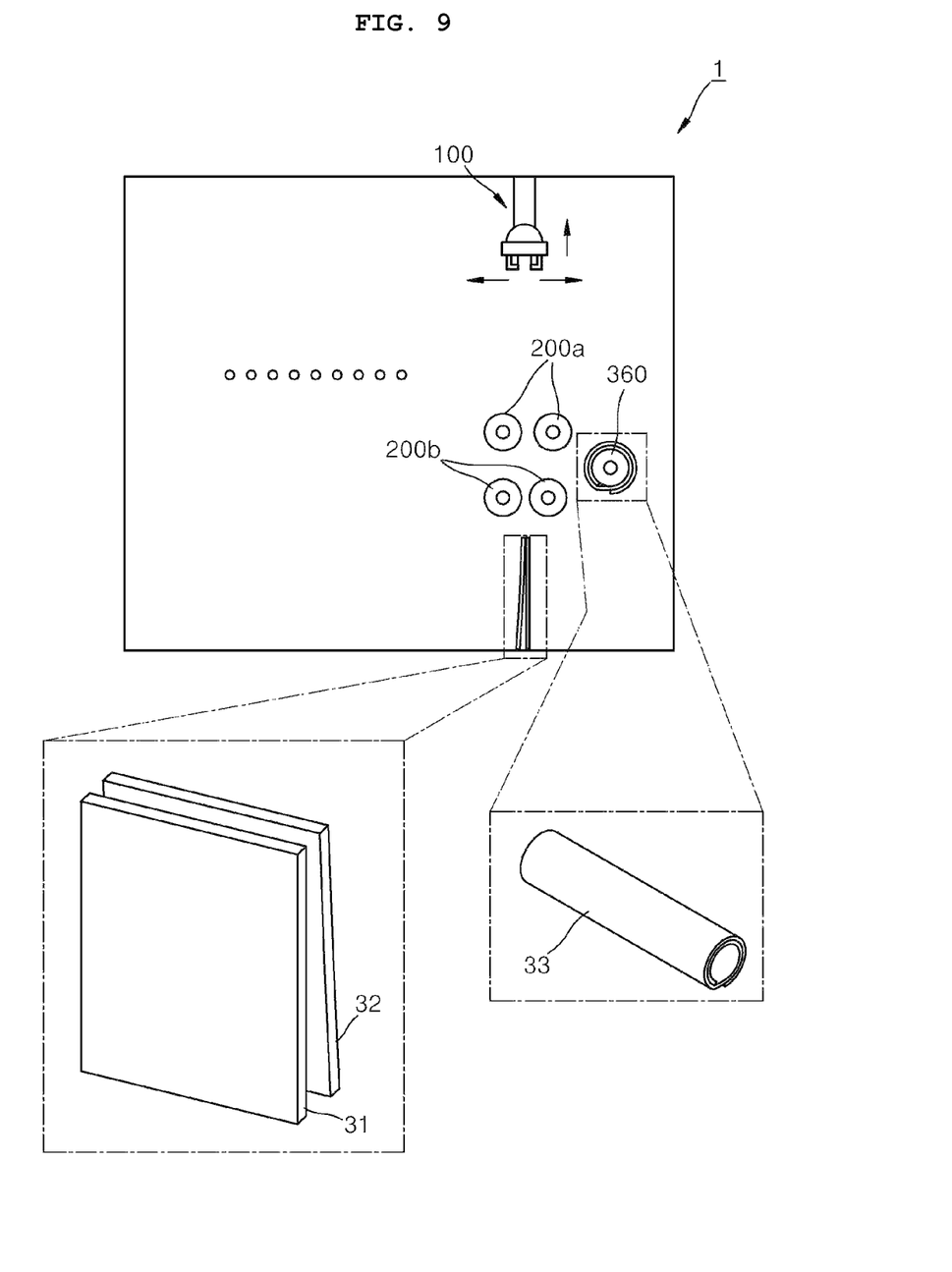

FIGS. 5 to 7 illustrate preparation steps before the layers of the solar panel 30 are separated, and FIGS. 8 and 9 illustrate steps of separating the layers of the solar panel 30.

With reference to FIG. 5, the solar panel 20 is inserted horizontally from one side and is transported in one direction along with rotation of the horizontal moving mechanism 500. The solar panel 30 can receive radiant heat from the heater (see 600 in (b) of FIG. 2) positioned at both sides in a transport process, and thus a temperature of the solar panel can be increased. When the temperature of the solar panel 30 is increased, the adhesive layers 35 which adhere the thin layers can be melt and have low adhesive strength. That is, the solar panel 30 can be transported along the horizontal moving mechanism 500 to be supplied to the panel transporting mechanism 100 positioned behind the horizontal moving mechanism 500 in a state where the solar panel is preheated.

With reference to FIG. 6, the panel transporting mechanism 100 can be positioned behind the horizontal moving mechanism 500 and can hold the solar panel 30 transported along the horizontal moving mechanism 500. In this case, the manipulation element 120 is moved along the frame 10 to a side of the horizontal moving mechanism 500 and causes the holder 110 to be located at the end portion of the solar panel 30. Here, the length of the body of the vertical manipulation element 121 is extended to locate the holder 110 at a height of the solar panel 30, and the rotational manipulation element 122 is rotates the holder 110 in a clockwise direction. The holder 110 moved by the manipulation element 120 holds the end portion of the solar panel 30 by using the fixing pincers 112.

With reference to FIG. 7, the panel transporting mechanism 100 vertically lifts the solar panel 30 held in a horizontal state and transports the solar panel above the first guide roller units 200a. In this case, the heaters 600 can be positioned at both sides of the panel transporting mechanism 100, and the solar panel 30 preheated at the horizontal moving mechanism 500 can be re-heated at the panel transporting mechanism 100. That is, the heater 600 can be positioned at a side portion of at least one of the horizontal moving mechanism 500 and the panel transporting mechanism 100 and can heat the solar panel 30. In addition, the solar panel 30 is located between the pair of first guide roller units 200a by the panel transporting mechanism 100. In this case, the image recognition unit 400 can be positioned below the pair of guide roller units 200, can image relative locations of the solar panel 30 and the wire cutting mechanism 300, and can adjust the locations thereof. In particular, when the second guide roller units 200b block a field of view of the image recognition unit 400, the pair of second guide roller units 200b can be moved, and the locations of the solar panel 30 and the first cutting wire 350a can be identified and adjusted. After fixing the location of the first cutting wire 350a, the image recognition unit 400 can also sequentially image and fix the location of the second cutting wire 350b in the same method as that for the first cutting wire 350a.

With reference to FIG. 8, in a state where location adjustment of the solar panel 30 is completed, the solar panel is lowered vertically by the panel transporting mechanism 100. The manipulation element 120 of the panel transporting mechanism 100 extends downward and lowers the solar panel 30 vertically. In this case, a leading end portion of the solar panel 30 is inserted into the pair of first guide roller units 200a and is lowered. The pair of first guide roller units 200a can lower the solar panel 30 to an accurate location while rotating depending on a traveling direction of the solar panel 30. The solar panel is vertically lowered while first cutting wire 350a penetrates the first adhesive layer 35 of the solar panel, and thus the backsheet layer 33 is separated therefrom. The separated backsheet layer 33 is made of a flexible material and is wound into the roll shape, and the discharge roller 360 can suction an end portion of the backsheet layer 33, wind the backsheet layer into a roll shape, and collect a roll of backsheet layer. In addition, the solar panel 30, from which the backsheet layer 33 is separated, can continue to be lowered in a state where the glass plate 31 and the solar cell layer 32 are adhered to each other with the second adhesive layer 35b, and the second cutting wire 350b can cut the second adhesive layer 35b such that the glass plate 31 and the solar cell layer 32 are separated from each other.

With reference to FIG. 9, when cutting of the first adhesive layer 35a and the second adhesive layer 35b is completed, the glass plate 31, the solar cell layer 32, and the backsheet layer 33 of the solar panel 30 are separated from each other, and the panel transporting mechanism 100 releases the fixing pincers 112 of the holder 110 and is lifted. In particular, the backsheet layer 33 can be discharged in the roll shape by the discharge roller 360, thus being easy to store and handle. When the discharge roller 360 fixes and holds the backsheet layer 33, the discharge roller fixes the backsheet layer 33 with the suction force generated due to negative pressure. In addition, when the backsheet layer 33 is completely separated from the solar cell layer 32 and is discharged, the backsheet layer 33 can be easily discharged by using air pressure which pushes the backsheet layer outwards. The glass plate 31, the solar cell layer 32, and the backsheet layer 33 which are separated from each other can be discarded or recycled through a recycling process of recycling separated layers suitably regarding materials thereof.

As described above, the embodiments of the present invention are described with reference to the accompanying drawings; however, a person of ordinary skill in the art to which the present invention pertains can understand that the present invention can be realized as another embodiment without changing the technical idea or an essential feature of the present invention. Therefore, the embodiments described above need to be understood as exemplified embodiments and not as embodiments to which the present invention is limited in every aspect.

The present invention has high industrial applicability in that the present invention can separate layers of a solar panel at once and the separated thin layers can be recycled suitably regarding materials thereof.

What is claimed is:

1. A solar panel cutting unit comprising:
   a frame;
   a panel transporting mechanism provided at the frame and configured to lower a solar panel in a vertical direction such that adhesion lines of thin layers of the solar panel are arranged downward;
   a pair of first guide roller units positioned below the panel transporting mechanism and configured to guide and lower the solar panel;
   a first wire cutting mechanism comprising a pair of first support rollers and a first cutting wire which connects the first support rollers to each other and extends in the same direction as the adhesion lines such that the first wire cutting mechanism separates any one of the thin layers from the solar panel; and a second wire cutting mechanism positioned below the first wire cutting mechanism, the second wire cutting mechanism comprising a pair of second support rollers and a second cutting wire which connects the second support rollers to each other and moves in parallel to the first cutting wire such that the second wire cutting mechanism separates another one of the thin layers from the solar panel.

2. The solar panel cutting unit according to claim 1, wherein the first wire cutting mechanism and the second wire cutting mechanism are individually movable in a horizontal direction such that a distance between the first cutting wire and the second cutting wire is adjusted.

3. The solar panel cutting unit according to claim 2, further comprising:

an image recognition unit provided below the first cutting wire and the second cutting wire, the image recognition unit configured to image the solar panel and the cutting wires and locate the adhesion lines and the cutting wires.

4. The solar panel cutting unit according to claim 1, wherein the solar panel has the adhesion lines formed in parallel between the thin layers, and wherein the first cutting wire is configured to cut any one of the adhesion lines to first separate any one of the thin layers, and the second cutting wire is configured to cut another one of the adhesion lines to sequentially separate another one of the thin layers.

5. The solar panel cutting unit according to claim 1, further comprising:

a pair of second guide roller units positioned between the first cutting wire and the second cutting wire, the pair of second guide roller units configured to guide the solar panel which moves past the first cutting wire and from which any one of the thin layers is removed, and supplies the solar panel to the second wire cutting mechanism.

6. The solar panel cutting unit according to claim 5, further comprising:

a discharge roller provided between the first cutting wire and the second guide roller units, the discharge roller configured to guide the thin layer separated from the solar panel, and discharge the solar panel outside.

7. The solar panel cutting unit according to claim 6, wherein the discharge roller is configured to suction and winds the thin layer into a roll shape and discharge the thin layer.

* * * * *